United States Patent
Carlin et al.

(10) Patent No.: US 7,155,442 B2
(45) Date of Patent: Dec. 26, 2006

(54) COMPRESSED NORMALIZED CHARACTER COMPARISON WITH INVERSION

(75) Inventors: Peter Carlin, Seattle, WA (US); Jun Fang, Sammamish, WA (US); Elizabeth Jean O'Neil, Cambridge, MA (US); Patrick Eugene O'Neil, Cambridge, MA (US)

(73) Assignee: Microsoft Corporation, Redmond, WA (US)

( * ) Notice: Subject to any disclaimer, the term of this patent is extended or adjusted under 35 U.S.C. 154(b) by 480 days.

(21) Appl. No.: 10/185,525

(22) Filed: Jun. 28, 2002

(65) Prior Publication Data

US 2004/0006569 A1    Jan. 8, 2004

(51) Int. Cl.
*G06F 7/08* (2006.01)

(52) U.S. Cl. .............. 707/101; 707/1; 707/2
(58) Field of Classification Search ............ 707/100, 707/101, 6, 2, 3; 704/8; 341/90; 714/759
See application file for complete search history.

(56) References Cited

U.S. PATENT DOCUMENTS

| 5,440,482 | A | * | 8/1995 | Davis ............... 707/6 |
| 5,682,158 | A | * | 10/1997 | Edberg et al. ....... 341/90 |
| 5,793,381 | A | * | 8/1998 | Edberg et al. ....... 345/467 |
| 6,438,516 | B1 | * | 8/2002 | Davis ............... 704/8 |

OTHER PUBLICATIONS http://www.maths.abdn.ac.uk/~igc/tch/mx4002/notes/node59.html, Ian Craw, Oct. 23, 2000.*
http://www.unicode.org/reports/tr10/tr10-4.html, Mark Davis and Ken Whishtler, Jun. 23, 1999.*
Timothy Bell, Ian H. Witten, John G. "Modeling for text compression" vol. 21, Issue 4 Dec. 1989 pp. 557-591 ISSN:0360-0300.*
Chowdhury, A. et al., "Collection Statistics for Fast Duplicate Document Detection", *ACM Transactions on Information Systems*, Apr. 2002, 20(2), 171-191.
Davis, M. et al., Unicode Technical Standard #10, "Unicode Collation Algorithm", www.unicode.org/unicode/reports/tr10, Mar. 23, 2001, 45 pages.
Pugh, W. "Compressing Java Class Files", *Proceedings of the ACM SIGPLAN '99 Conference on Programming Language Design and Implementation*, May 1999, 34(5), 247-258.

* cited by examiner

*Primary Examiner*—Paul Rodriguez
*Assistant Examiner*—Luke Osborne
(74) *Attorney, Agent, or Firm*—Woodcock Washburn LLP

(57) ABSTRACT

Any string in any character set with an arbitrary-leveled weight-based comparison system is transformed into a bit-string in such a way that two transformed strings can be compared byte-by-byte. The resulting bit string has the minimum possible maximum length. The transformed bit strings can be inverted—meaning the original string can be recovered from the transformed string.

13 Claims, 5 Drawing Sheets

Tree T1
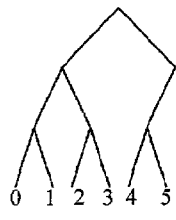
Fig. 4
Tree T2
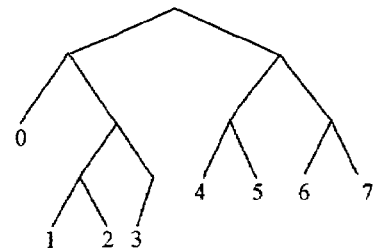
Fig. 5
| AL | W1 | W2 |
|----|----|----|
| 3  | 1  | 1  |
| 7  | 1  | 2  |
| 5  | 1  | 3  |
| 6  | 1  | 4  |
| 8  | 2  | 1  |
| 1  | 3  | 1  |
| 2  | 3  | 2  |
| 4  | 4  | 1  |
Fig. 6
Tree T3
Tree T3
Tree T3
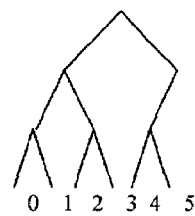
Fig. 7A  Fig. 7B  Fig. 7C

| AL | W1 | W2 | B1\|B2 |
|---|---|---|---|
| 1 | 1 | 1 | 001\|001 |
| 2 | 1 | 2 | 001\|010 |
| 3 | 1 | 3 | 001\|011 |
| 4 | 1 | 4 | 001\|100 |
| 5 | 2 | 1 | 010\|1 |
| 6 | 3 | 1 | 011\|01 |
| 7 | 3 | 2 | 011\|10 |
| 8 | 4 | 1 | 100\|1 |

Fig. 8

| AL | W1 | W2 | B1\|B2 |
|---|---|---|---|
| 3 | 1 | 1 | 01\|001 |
| 7 | 1 | 2 | 01\|010 |
| 5 | 1 | 3 | 01\|011 |
| 6 | 1 | 4 | 01\|100 |
| 8 | 2 | 1 | 10000\| |
| 1 | 3 | 1 | 101\|01 |
| 2 | 3 | 2 | 101\|10 |
| 4 | 4 | 1 | 11000\| |

Fig. 9

COMPRESSED NORMALIZED CHARACTER COMPARISON WITH INVERSION

FIELD OF THE INVENTION

This invention relates in general to the field of database management systems performed by computers. More particularly, this invention relates to a efficient processing of database queries.

BACKGROUND OF THE INVENTION

Each character in a conventional character set can be represented as a number of hexadecimal digits. Although some of these character sets have a sequential ordering of weights used for comparison, the values for comparison are typically expanded to a much larger size and cannot be inverted.

For example, each character in the Unicode Standard is represented by a 2-byte value that is specified as 4 hexadecimal digits, from 0x0000 to 0xFFFF. For example, the Latin character capital "A" is represented in Unicode (UC) as 0x0041.

The international Unicode character standard was defined without a detailed ordering on its characters, although the concept of "Levels of Comparison", which is translated as "Weights" in Microsoft NT produced by Microsoft Corporation of Redmond, Wash., is covered in the Unicode Standard 3.0. Microsoft NT defined an ordering of Unicode much earlier, based on the lexicographic order of a hierarchical sequence of weights, and this ordering was adopted in Microsoft SQL Server indexes.

Transformation of Unicode strings into strings of byte-weights that can be compared byte-by-byte has existed in NT for some time. However, this conventional byte-weight solution is characterized by expansion of Unicode UC values to a much larger size, and does not provide the ability to invert the result to recover the original Unicode string.

The previous approach to indexing Unicode strings in SQL Server was to hold the strings in their original Unicode form, and compare the strings using the "DBLCCompareString" call, which performed a finite-state machine calculation based on NT weights. This used a lot of CPU processing power in comparisons, and also made prior key prefix compression of strings in index entries less effective (because Unicode strings with different prefix character sequences could sort together).

In view of the foregoing, there is a need for systems and methods that normalize character sets, such as Unicode, to a compressed, invertible representation that overcomes the limitations and drawbacks of the prior art.

SUMMARY OF THE INVENTION

The present invention overcomes these problems by defining a normalizing transformation (also referred to herein as "NTransform") on any string of Unicode characters into a bitstring (e.g., a (0–1)-bitstring), in such a way that two such transformed strings can be compared byte-by-byte. The bitstring from the NTransform is preferably no more than twice as long as the Unicode string it transforms (i.e., 4 bytes per character); thus, it can take the place of the original Unicode string in index values without breaking customer legacy indexes, given that the length of index keyvalues was doubled for the targeted SQL Server release, for example.

Compression is based on a minimax technique used to generate prefix-coded bitstrings from transformed character weights.

Furthermore, the NTransformed bitstrings support inversion, meaning that the original Unicode string can be recovered from the transformed string.

Multiple weights (a primary weight, a secondary weight, etc.) are provided for each character. These weights are pre-assigned.

According to an embodiment of the invention, a character string to be transformed is received. A set of weights for each character is then retrieved from a previously generated weight table. A compressed bitstring based on the weights is generated using a normalizing transformation. Ultimately, at a later time, the generated bitstring can be inverted to recover the original character string.

According to another embodiment of the present invention, character strings to be compared, to determine which is greater, are received and transformed to generate respective bitstrings comprising a primary weight, a secondary weight, and perhaps additional weights. The primary weights are compared to determine which bitstring is greater. If one of the primary weights is larger than the other, a determination can be made. If the primary weights are equal, then no determination can be made at this point, and the secondary weights are compared. If one of the secondary weights is larger than the other, a determination of which bitstring is greater can be made. If the secondary weights are equal, then no determination can be made at this point, and any additional weights, such as tertiary weights, are then compared in a similar fashion. If no determination can be made, the process exits without determining which of the two bitstrings is greater. It can be assumed at such a point that the two bitstrings are equal.

Additional features and advantages of the invention will be made apparent from the following detailed description of illustrative embodiments that proceeds with reference to the accompanying drawings.

BRIEF DESCRIPTION OF THE DRAWINGS

The foregoing summary, as well as the following detailed description of preferred embodiments, is better understood when read in conjunction with the appended drawings. For the purpose of illustrating the invention, there is shown in the drawings exemplary constructions of the invention; however, the invention is not limited to the specific methods and instrumentalities disclosed. In the drawings:

FIG. 4 shows an exemplary binary tree in accordance with the present invention;

FIG. 5 shows another exemplary binary tree in accordance with the present invention;

FIG. 6 shows an exemplary weight ordering of an exemplary alphabet in accordance with the present invention;

FIGS. 7A, 7B, and 7C show additional exemplary binary trees in accordance with the present invention;

FIG. 8 shows exemplary weight bitstrings for an exemplary alphabet in accordance with the present invention; and FIG. 9 shows exemplary constant length weight bitstrings for an exemplary alphabet in accordance with the present invention.

DETAILED DESCRIPTION OF PREFERRED EMBODIMENTS

Overview

Techniques are provided for normalizing Unicode for SQL Server indexes to a compressed, invertible representation, which provides enhanced performance.

The present invention provides a normalizing transformation on any string of Unicode characters to a bitstring in such a way that two such transformed strings can be compared byte-by-byte. The resulting bit string is preferably no more than twice as long as the Unicode string it transforms (i.e., 4 bytes/character); thus, it can take the place of the original Unicode string in index values without breaking customer legacy indexes. The transformed bit strings are further defined to support inversion, meaning that the original Unicode string can be recovered from the transformed string. Inversion is desirable for "covering indexes", which are indexes with key values from which exact values of strings indexed can be recovered, without need to access the underlying row data.

The present invention can be implemented in a variety of languages and tools such as C, SQL, OLE DB, and Managed Code, produced by Microsoft Corporation of Redmond, Wash. The present invention is application schema neutral and works with Windows2000 and SQL2000, for example. Moreover, the invention can be used with other languages, tools, Web services, applications, and APIs, for example.

Exemplary Computing Environment

Figure 1:
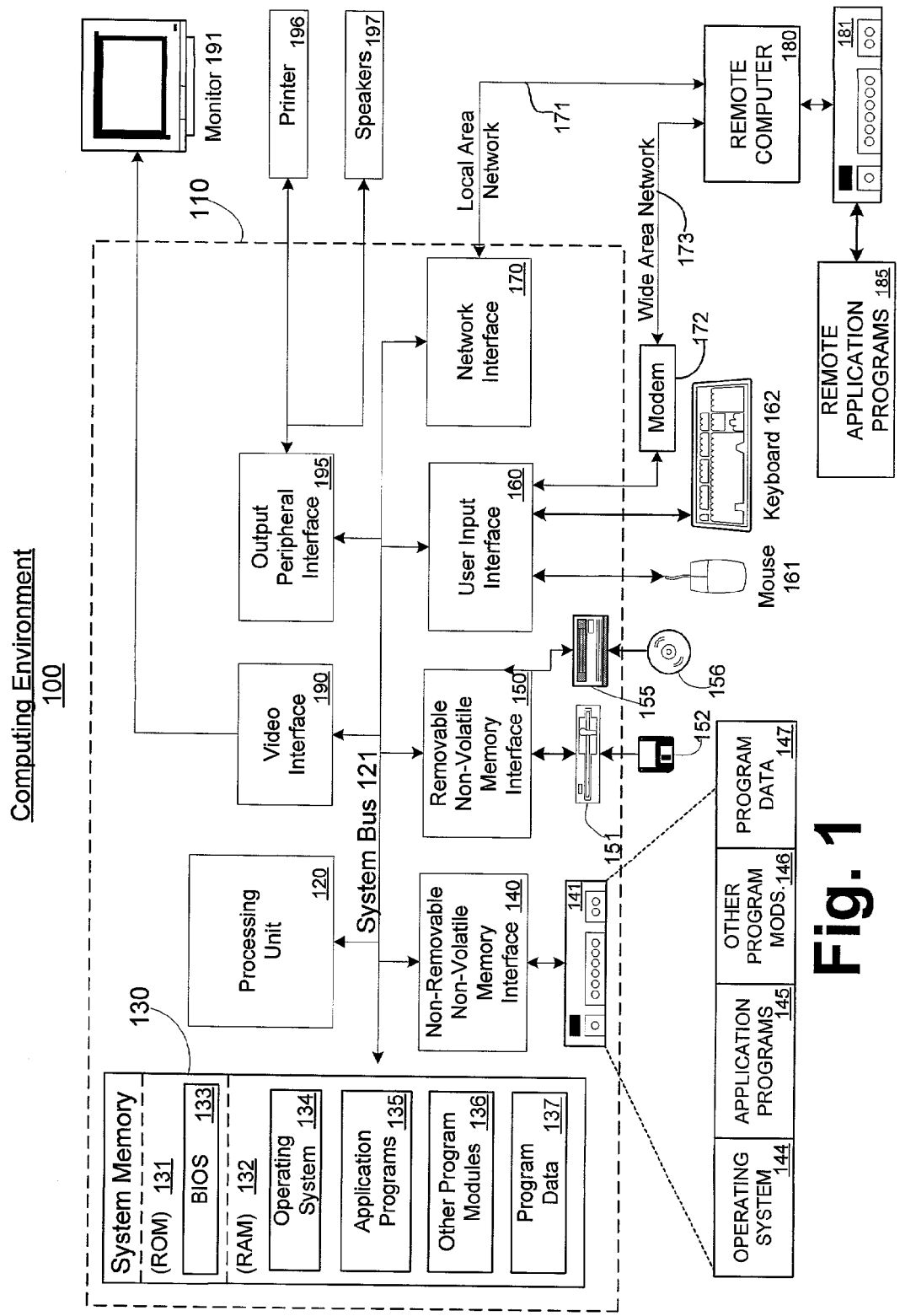
FIG. 1 is a block diagram showing an exemplary computing environment in which aspects of the invention may be implemented.

Database systems are implemented on a computer. FIG. 1 and the following discussion are intended to provide a brief general description of a suitable computing environment in which the invention may be implemented. Although not required, the invention will be described in the general context of computer-executable instructions, such as program modules, being executed by a computer, such as a client workstation or a server. Generally, program modules include routines, programs, objects, components, data structures and the like that perform particular tasks or implement particular abstract data types. Moreover, those skilled in the art will appreciate that the invention may be practiced with other computer system configurations, including hand-held devices, multi-processor systems, microprocessor-based or programmable consumer electronics, network PCs, minicomputers, mainframe computers and the like. The invention may also be practiced in distributed computing environments where tasks are performed by remote processing devices that are linked through a communications network. In a distributed computing environment, program modules may be located in both local and remote memory storage devices.

FIG. 1 illustrates an example of a suitable computing system environment 100 in which the invention may be implemented. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multi-processor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network or other data transmission medium. In a distributed computing environment, program modules and other data may be located in both local and remote computer storage media including memory storage devices.

With reference to FIG. 1, an exemplary system for implementing the invention includes a general purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 110 typically includes a variety of computer readable media. Computer readable media can be any available media that can be accessed by computer 110 and includes both volatile and non-volatile media, removable and non-removable media. By way of example, and not limitation, computer readable media may comprise computer storage media and communication media. Computer storage media includes both volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media. **

The system memory 130 includes computer storage media in the form of volatile and/or non-volatile memory such as ROM 131 and RAM 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computer 110 may also include other removable/non-removable, volatile/non-volatile computer storage media. By way of example only, FIG. 1 illustrates a hard disk drive 140 that reads from or writes to non-removable, non-volatile magnetic media, a magnetic disk drive 151 that reads from or writes to a removable, non-volatile magnetic disk 152, and an optical disk drive 155 that reads from or writes to a removable, non-volatile optical disk 156, such as a CD-ROM or other optical media. Other removable/non-removable, volatile/non-volatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media, discussed above and illustrated in FIG. 1, provide storage of computer readable instructions, data structures, program modules and other data for the computer 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 110 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 190.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 1. The logical connections depicted include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 1 illustrates remote application programs 185 as residing on memory device 181. It will be appreciated that the network connections shown are exemplary and other means of establishing a communications link between the computers may be used.

As noted, the computer described above can be deployed as part of a computer network. In general, the above description applies to both server computers and client computers deployed in a network environment.

Exemplary Embodiments

The present invention defines a normalizing transformation (also referred to herein as "NTransform") on any string of Unicode characters into a bitstring (e.g., a (0–1)-bitstring), in such a way that two such transformed strings can be compared byte-by-byte. The bitstring from the NTransform is preferably no more than twice as long as the Unicode string it transforms (i.e., 4 bytes per character); thus, it can take the place of the original Unicode string in index values without breaking customer legacy indexes, given that the length of index keyvalues was doubled for the targeted SQL Server release, for example.

Compression is based on a minimax technique used to generate prefix-coded bitstrings from transformed character weights.

Furthermore, the NTransformed bitstrings support inversion, meaning that the original Unicode string can be recovered from the transformed string. Inversion arises from a desire to provide "covering indexes": indexes with keyvalues from which exact values of strings indexed can be recovered, without need to access underlying row data. Invertibility is also referred to as "reversibility".

The NTransform techniques of the present invention can be generalized to provide the features of normalization, compression, and invertibility to data types other than Unicode strings, such as ANSI collation sequences, for example. The present invention can also be implemented with Unicode characters whose encoding uses more than two bytes.

Multiple weights (a primary weight, a secondary weight, etc.) are provided for each character. These weights are pre-assigned. Although examples are described herein with three weights, it is contemplated that a number of weights other than three, such as two, or greater than three, can be used in conjunction with the present invention.

Figure 2:
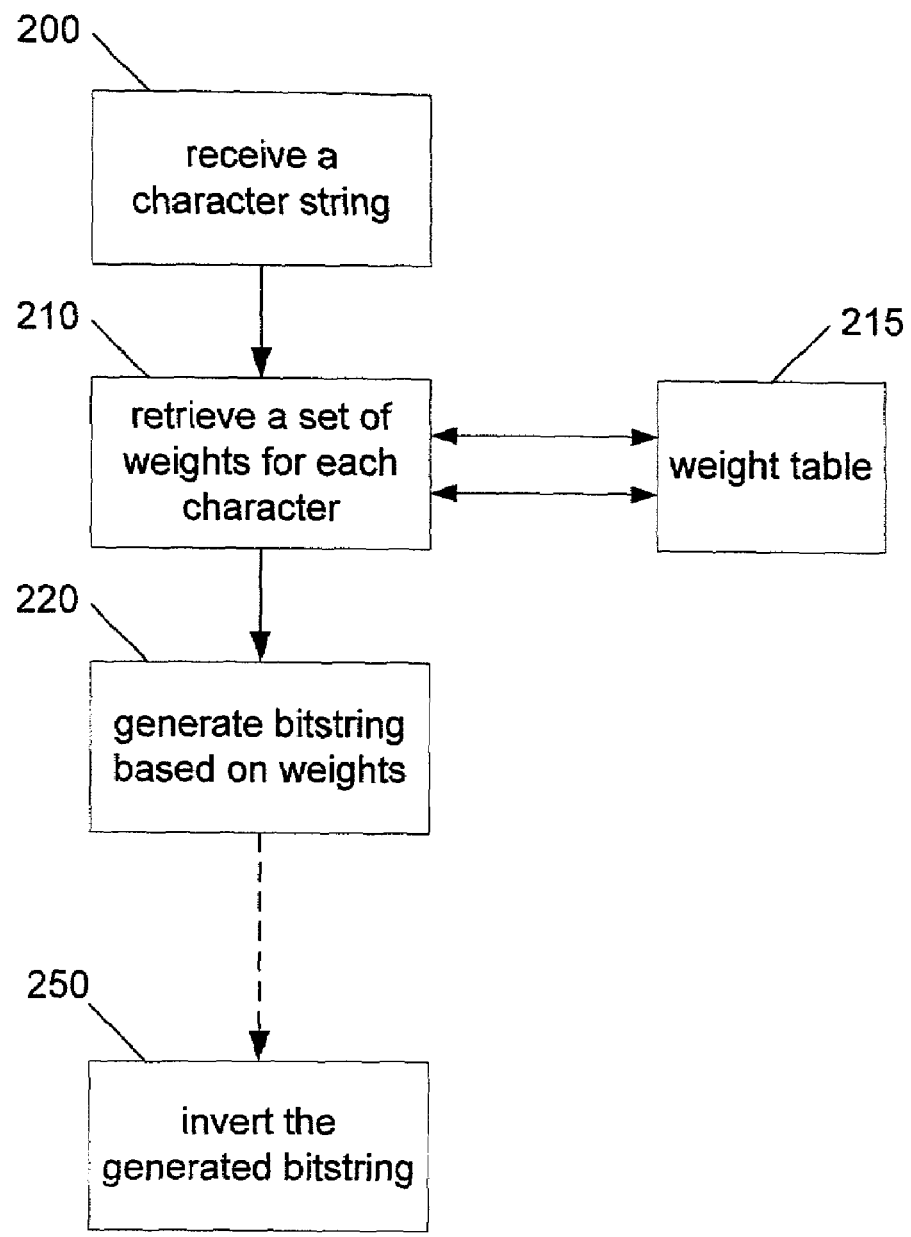
FIG. 2 is a flow diagram of an exemplary process in accordance with the present invention.

FIG. 2 is a flow diagram of an exemplary bitstring generation process in accordance with the present invention.

At step 200, a character string to be transformed is received. A set of weights for each character is retrieved, at step 210, from a previously generated weight table 215. A compressed bitstring based on the weights is generated at step 220, using a normalizing transformation. Optionally, at a later time, shown as step 250, the generated bitstring can be inverted to recover the original character string. Additional details on the process of FIG. 2 are provided below.

The compressed bitstring encoding is generated ahead of time and stored in a memory or other storage device, and the bitstrings for each character are retrieved at a later time when needed. During a preparation phase, the weights for all characters are obtained and the compressed encoding for each character, along with an extended Unicode value ("XUC", described further below), is generated. For each character and XUC, the bitstring of all weights parts is stored in a memory (e.g., a table in memory) or other storage device. During a subsequent runtime normalization phase, after receiving a string, the compressed encoding for each character is retrieved.

Figure 3:
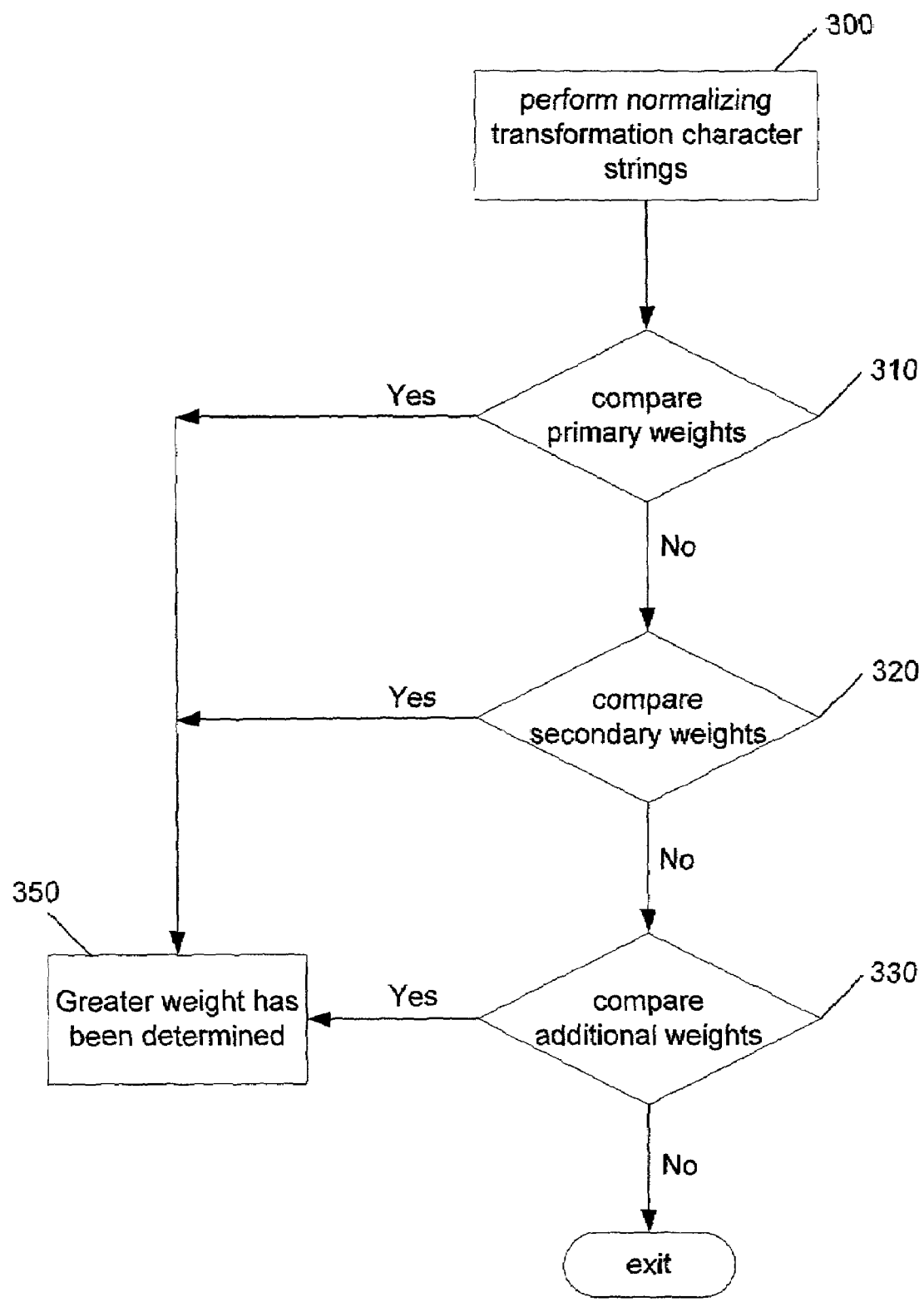
FIG. 3 is a flow diagram of another exemplary process in accordance with the present invention.

FIG. 3 is a flow diagram of an exemplary comparison process of two or more character strings in accordance with the present invention. Initially, at step 300, the character strings to be compared, to determine which is greater, are transformed to generate respective bitstrings comprising a primary weight, a secondary weight, and perhaps additional weights. At step 310, the primary weights are compared to determine which bitstring is greater. If one of the primary weights is larger than the other, a determination can be made at step 350. If the primary weights are equal, then no determination can be made at this point, and the secondary weights are compared at step 320. If one of the secondary weights is larger than the other, a determination of which bitstring is greater can be made at step 350. If the secondary weights are equal, then no determination can be made at this point, and any additional weights, such as tertiary weights, are then compared in a similar fashion at step 330. If no determination can be made, the process exits without determining which of the two bitstrings is greater. It can be assumed at such a point that the two bitstrings are equal. Additional details on the process of FIG. 3 are provided below.

For example, for Latin character capital "A", an exemplary entry in a base table is: "0x0041 14 2 2 18 0", where the first column entry (0x0041) is the Unicode value (referred to herein as "UC"). The numerical entries that follow are different "weights" (UW, DW, CW) for each character, which factor the character representation into orthogonal parts that determine the sort order. The first weight is referred to herein as "UW" and is preferably a 2-byte pair, partitioned into the value pair (UW1, UW2) which corresponds to (14, 2) above, and is equivalent to UW=0x0E02 in combined hex form. The UW weight determines the character "category": e.g., the "letter A" category, with a number of variants. The variants are determined by the succeeding weights.

The second weight is referred to as "DW" (where "D" stands for "diacritical" mark, such as circumflex (^)). Accordingly, the fourth entry value in the example above, DW=2=0x02, indicates no diacritical mark. DW differentiates variants in some character categories (usually the Western alphabetic characters), e.g., A vs. Â.

The third weight is referred to as "CW" (where "C" stands for "Case/Kana" weight), and in this example CW=18. CW differentiates certain character categories, typically by case in standard Western alphabets, e.g., A vs. a. Thus, the (UW, DW, CW) weight triple for the Latin capital letter A above is represented as ((14, 2), 2, 18).

Note that the 0 at the last position above is not a weight, but a flag, used to help recognize "compression" sequences, and is described further below.

In the (UW, DW, CW) triple of weights, UW is the "primary" weight, DW is the "secondary" weight, and CW is the "tertiary" weight. In comparing two Unicode strings, the corresponding sequence of primary UW weights determines the order first, e.g., "letter A category" is less than "letter B category".

If two strings have the same sequence of (primary) UW weights, then the (secondary) DW weights are considered. If two strings have the same sequence of DW weights as well (as they would for "Bigbuy" and "BIGBUY", for example), then the sequence of (tertiary) CW weights will determine the order (lower case comes before upper case).

Given a character string to be sorted, each character in the resulting string is factored into its distinct weights, and the weights are placed successively in distinct "weight strings" in which each weight is represented by a (0–1)-bit sequence, as shown below with respect to the Example below. There is a UW weight string, a DW weight string, and a CW weight string, with successive weights in each string corresponding to successive characters. The weight strings are then concatenated in a given order, with "low-value separators" placed between the different weight strings, resulting in a final concatenated weight string. Once this is done, the order of a pair of character strings is determined by a byte-by-byte comparison of the corresponding concatenated weight strings.

To generate compressed (0–1)-bitstrings to represent NT weights, the NT weights (which each occupy 1 or 2 bytes in the original NT definition) are translated into bitstring values from 1 to K in the same order as the NT weights, where K is the number of weights of each type that are to be used. Then the binary (bit-by-bit) comparison of the concatenated Unicode concatenated weight bitstring provides the same order as the analog for NT weights. For example, for case weights CW 0x02 and 0x03, bitstrings 01 and 10 are used. The all-0 bitstring (00, 000, etc.) is used as a "low-value separator" to separate one weight string from the next.

Inversion back to Unicode characters from NT weights has long been considered impossible, because there are many pairs of Unicode characters in a standard base table with equal weights. For example, 0xFE93 and 0x0629 have equal weights and are represented as:

| | | | | | | |
|---|---|---|---|---|---|---|
| 0xFE93 | 19 | 19 | 8 | 2 | 0 | ;Arabic Glyph Isolate Taa Marbutah |
| 0x0629 | 19 | 19 | 8 | 2 | 0 | ;Arabic Taa Marbutah |

Given that information is lost in transforming from Unicode value UC to the (UW, DW, CW) weights, and these weights are the only determinant of the sort order, there is a question as to how such duplicate weight characters can be distinguished.

SQL Server carries inversion information in its index values using a storage format where the inversion information and the concatenated bitstring information are held as separate "columns" or fields. In the index keyvalue header is a "CmpLngth", which is the length of the concatenated bitstrings to be compared, and an "InvLngth", which is the length of the information needed for inversion. The InvLngth value measures the length of the IW_string, a sequence of IW weights corresponding to characters transformed from the original Unicode string which now are to be inverted. Note that the IW weight is not a weight taken into account in the comparison, but it contains information to differentiate two characters with equal weights, for inversion.

Assuming that there are k weights used in comparison, there will be k weight strings: $W1_{13}$ str, $W2\_str, \ldots, Wk_{13}$ str, and the inversion weight string, $IW_{13}$ str. Thus, the NTransformation would result in an index keyvalue such as:

| CmpLngth | InvLngth | W1_str | W2_str | ... | Wk_str | IW_str |
|---|---|---|---|---|---|---|

Keyvalue comparison would begin with $W1_{13}$ str, after the two Length values in the header.

The inversion information carried in the $IW_{13}$ str is augmented by the corresponding information in the (UW, DW, CW) values in the comparison string.

An example is now described using a simple character set.

EXAMPLE

Concatenated Unicode Weight String

Assume the letters: a, à, A, À, e, è, E, and È have Unicode weights and corresponding bitstring representations given in Table 1.

TABLE 1

| Letter | Unicode UC | UW | UW bitstring | DW | DW bitstring | CW | CW bitstring |
|---|---|---|---|---|---|---|---|
| a | 0x0061 | (14, 2) | 01 | 2 | 01 | 2 | 01 |
| A | 0x0041 | (14, 2) | 01 | 2 | 01 | 18 | 10 |
| à | 0x00e0 | (14, 2) | 01 | 15 | 10 | 2 | 01 |
| À | 0x00c0 | (14, 2) | 01 | 15 | 10 | 18 | 10 |
| e | 0x0065 | (14, 33) | 10 | 2 | 01 | 2 | 01 |
| E | 0x0045 | (14, 33) | 10 | 2 | 01 | 18 | 10 |
| è | 0x00e8 | (14, 33) | 10 | 15 | 10 | 2 | 01 |
| È | 0x00c8 | (14, 33) | 10 | 15 | 10 | 18 | 10 |

Note that these characters are placed in Table 1 by increasing order of weights (UW, DW, CW). The sequence starts with four UW weights the same (letter category "A"), smaller than the final four (letter category "E"). For UW weights that are the same, the DW weights increase (in blocks of 2, without and then with diacritic mark ""), and for UW and DW weights that are the same, the CW weights increase (lowercase, then uppercase), giving eight distinct patterns of triples. The Unicode UC values for this set of characters are not in numerical order. The sort order is not determined by the UC values, but by the weight tuples. The bitstrings range from 01 to 10, increasing in the same order as the disparate pairs of weight values, (14, 2) and (14, 33) for UW, 2 and 15 for DW, 2 and 18 for CW.

As an example, the Unicode character string "Aea" will have a concatenated Unicode weight bitstring determined as follows. First, note that there are no rules that transform any sequence of characters in the current example (i.e., there are no compressions or expansions, described further below.). Thus, the concatenated sequence of bitstrings for UW values of Aea is 011001; this is followed by a separator 00; then the concatenated sequence for DW values is 010101 and separator 00; finally the concatenated sequence for CW values is 100101 and no separator is needed after it because no sequence follows this one. However, the concatenated bitstring is padded out with zeros so as to be able to perform a byte-by-byte compare between strings. Thus:

| | |
|---|---|
| Aea: | 011001000101010010010100. Comparing this to Àèa: |
| Aea: | 011001000101010010010100 |
| ÀèA: | 011001001010010010011000 |

The first difference occurs in first diacritical mark position, in which Aea is smaller. This is expected because the strings have the same characters (ignoring diacritical marks and case), and diacritical marks determine secondary weights, whereas case determines only tertiary weights.

The present invention is applicable to all character sets, though certain provisions should be made for languages with special characters or rules (e.g., Hungarian). Exceptions can also be made for characters or characteristics that should be ignored or treated in a certain way, for example to have à (the letter a-gràve) sort the same as a(the letter a followed by the "non-spacing" diacritic character ; this will be discussed further below). It is contemplated that punctuation characters, such as the hyphen and apostrophe characters, are not assigned (UW, DW, CW) weights, and instead can be given another weight (such as SW) that is taken to be last of all weights in determining sort order.

Certain locales support compression, where two-character and sometimes three- or four-character combinations are merged into a sequence of one or two characters. Because the resulting compressed characters can also exist in their own right, there is ambiguity in the inverse NTransform. This problem is overcome by creating a duplicate weight tuple for the first character of the compressed character sequence in the New Weights table, differentiated from the regular character with the same weight by a new UC value, called an XUC or Extended UC.

The locale descriptor has a flag to characterize when compression sequences exist, and when they do, a list of such sequences is pointed to. For example, in Czech, Table 2:

TABLE 2

| UC1 | UC2 | UW1 | UW2 | DW | CW | XUC | Compressed character |
|---|---|---|---|---|---|---|---|
| 0x0063 | 0x0068 | 14 | 46 | 2 | 2 | 0x10D54 | ;ch |
| 0x0043 | 0x0068 | 14 | 46 | 2 | 18 | 0x10D55 | ;Ch |
| 0x0043 | 0x0048 | 14 | 46 | 2 | 26 | 0x10D56 | ;CH |

In Table 2, the UC1 and UC2 are UC values for the letter 'c' followed by the letter 'h' in three different upper/lower case combinations into single characters represented as 'ch', 'Ch', and 'CH' The UW1, UW2, DW, and CW represent the weights in the New Weights table that the pair of characters will be replaced by in the output string. Note that XUC represents the first (in this case) resulting compression character, and XUC will be used to determine output.

When an input Unicode string is being transformed into a bitstring, the logic of the transformation desirably notices if a character to be transformed is the first character of such a compression list, so it looks at the list of compressions in memory, accessible by UC1, UC2 if the first character is recognized as the first of a compression sequence, then successive characters are examined in the input string to determine if the compressed character weight should be used to generate the output bitstring. If not, then letters in the input string that have been matched so far are handled in the usual way.

Generating Transformed Bitstrings for Unicode Characters

Consider now characters placed in order in a "New Weights" table by their (UW, DW, CW, IW) weight tuples. It is desirable to transform each of the individual character weights into distinct weight bitstrings. Each character has a hierarchy of weight bitstrings, and these are concatenated together (using a bar "|" to show where one weight bitstring ends and another begins) to generate a concatenated weight bitstring. For example, below on the right is an exemplary concatenated weight bitstring for the character "a".

| UC | UW1 | UW2 | DW | CW | ;Character | UW|DW|CW|IW| |
|---|---|---|---|---|---|---|
| 0061 | 14 | 2 | 2 | 2 | ;a | 00000000001001110001100100| |

As these weight tuples are passed through in increasing order, each successive concatenated weight bitstring is generated by applying a type of integer succession to the individual weight bitstrings. It is desirable to generate all concatenated weight bitstrings in such a way that their total length remains approximately the same. These concatenated weight bitstrings are generated using a minimax strategy, so that the worst total length of the weight bitstrings will be about the same for all characters, giving a fixed amount of encryption space for all weights taken together. For character categories determined by a UW value which have many variants, the UW bitstring is desirably short enough to allow space for all the different later weights (namely DW, CW, and IW) that differentiate the variants compared. The ability to generate multiple DW weights because of succeeding non-spacing diacritical characters in a Unicode string is addressed by an approach that uses a default DW in the New Weights table.

The description of how the bitstrings are generated to represent Unicodes in the concatenated weight bitstring approach defines the compression aspects of the invention.

Prefix Bitstrings

A set of prefix bitstrings is created (where no one bitstring in the set is a prefix of another bitstring, meaning that the set has a prefix property) to represent N distinct characters of an alphabet, where the bitstrings have the same order as the characters of the alphabet. Thus, if "f" is represented by 100101 and "p" is represented by 101110, then f<p means 100101<101110.

The prefix property will hold if all bitstrings in the set are distinct and of equal length. In the binary tree T1 of FIG. 4, bitstrings for leaf nodes of the tree are determined by proceeding down from the root to the leaf, counting descents to a left-child as a 0 and descents to a right-child as a 1.

In tree T1, 0 is encoded 000, 1 is encoded 001, 2 is encoded 010, ... and 5 is encoded 101. Note that binary trees can have nodes with only one descendent in some cases. There is no right-child of the internal node of T1 which is the right-child of the root. Here, all bitstrings are distinct and have the same length.

In tree T2, as shown in FIG. 5, 0 is encoded as 00, 1 as 0100, 2 as 0101, 3 as 0110, 4 as 100, 5 as 101, 6 as 110, and 7 as 111. No leaf node of a binary tree has a bitstring that is a prefix of a bitstring of another leaf node. Only interior nodes, if they had bitstrings assigned in the same way, would have bitstrings that were prefixes of the leaf nodes that fell below them.

It is noted that all possible prefix encodings of an ordered sequence of M characters of an alphabet can be represented as leaf nodes of some binary tree with M leaves labeled starting with 1, where successive labeled leaves encode successive characters of the alphabet.

A sequence of prefix bitstrings can encode any ordered sequence of alphabetic characters. For example, given the ordered characters 1 to 7 of tree T2, the sequence 42731 can be represented as the bitstring 100010111101100100. The "alphabet" bitstrings can be separated, 100.0101.111.0110.0100, and read off the alphabet characters: 100 is 4, 0101 is 2, 111 is 7, 0110 is 3, 0100 as 1, giving the sequence that was set out to be encoded: 42731. Because no bitstring is a prefix of another, it is known when one bitstring ends (follow along descending the binary tree in the 0–1 encryption until a leaf is reached) and the next one begins (start again at the roof of the tree). This encoding was constructed so that the bitstrings encode the letters in an order faithful to the native order of the alphabet. Thus, two encoded strings of characters can be compared as bitstrings to determine the alphabetic order.

The present invention generates ordered bitstring encodings of an alphabet to minimize the length of the longest bitstrings, which is referred to herein as a minimax strategy. The equal-length bitstrings coming out of tree T1 are an example of a minimax strategy. This minimax strategy is used to transform strings of Unicode characters into bitstrings representing a hierarchy of weights that define the appropriate sort order, while minimizing the worst-case length of the Unicode strings thus encoded. For this purpose it is desirable to follow a minimax strategy to generate bitstring trees within all levels of the hierarchy, ending in leaves of equal depth (as in tree T1, above).

Encoding a Hierarchy of Weights

Assume a set of alphabet characters (designated with a column heading AL, and represented by natural numbers 1, 2, ... in FIGS. 6, 8, and 9), and that every alphabet character x has two weights, $W1(x)$ and $W2(x)$, also represented as integers, that determine the order of the characters lexicographically. The lexicographic order on the characters x and y in this exemplary alphabet is as follows: for any two characters x and y, x<y iff (($W1(x)<W1(y)$) or (($W1(x)=W1(y)$) and ($W2(x)<W2(y)$))). Symmetrically, y<x iff (($W1(y)<W1(x)$) or (($W1(x)=W1(y)$) and ($W2(y)<W2(x)$))). If (($W1(x)=W1(y)$) and ($W2(x)=W2(y)$)), then x=y.

FIG. 6 provides an ordering for the exemplary alphabet. Note that weights W1 and W2 ascend through the natural (ordinal) numbers 1, 2, 3.

It is now described how to determine bitstrings B1 and B2 to encode the weights W1 and W2 in such a way that the concatenated bitstrings for alphabetic characters x and y, $B1(x)\|B2(x)$ and $B1(y)\|B2(y)$, will have the same bitstring order as x and y by weights W1 and W2. One way is to assign successive bitstrings to the values 1, 2, 3, ... for both B1 and B2 (reserving the prefix bitstring for the value 0 to act as a separator of one bitstring from the next). Assuming K distinct weights W1 for the alphabetic characters, then the bitstrings B1 will be:

| W1 | B1 |
|---|---|
| 1 | 00 . . . 001 |
| 2 | 00 . . . 010 |
| 3 | 00 . . . 011 |
| 4 | 00 . . . 100 |
| ... | |
| K | 1? . . . ? ? ? |

The total number of bits in the B1 bitstring is ceil($\log_2$(K+1)). For the case in which K=3, then W1=1 and B1=01 W1=2 and B1=10, W1=3 and B1=11. If K=4, then W1=1 and B1=001, W1=2 and B1=010, W1=3 and B1=011, W1=4 and B1=100. These bitstrings can be generated for an arbitrary K by starting with an unknown but conceptually infinite number of leading zeros and a 1 on the far right (00 . . . 001), generating successive numbers by adding the bit one on the right, until when the final value for K is reached, all 0 bits to the left can removed. This is conceptually similar to building a binary tree starting from tree T3 in FIG. 7A and repeatedly adding new leaf nodes on the right (FIGS. 7B and 7C) splitting at higher and higher roots so that all leaf nodes end up at the same depth. The 0-value leaves still represent separators of weight bitstrings.

The above technique can be used for generating bitstrings B1 of equal length, but it is desirable to generate hierarchical strings B1|B2 for all characters x of the alphabet. In FIG. 8, which duplicates the W1 and W2 values of FIG. 6, the value W1=1 is associated with four values W2=1, 2, 3, 4 (0 does not represent a value for W1 or W2), with associated bitstrings B1=001 and B2=001, 010, 011, and 100; then W1=2 (B1=010) is associated with W2=1, bitstrings B2=1 (but see FIG. 9 in which, as a unique value, W2=1 does not need any bitstrings); for W1=3 (B2=011) is associated with W2=1, 2, bitstrings 01, and 10; and the value W1=4 (B1=100) has an associated W2 value 1 (B2=1), but again see FIG. 9 where B2 is empty.

As described above, to compare characters with weights W1 and W2, first compare weights W1 and only if they are equal, compare weights W2. The same holds for a string of alphabet characters, such as 42731: first compare all the W1 weights, and only if these are identical for all characters compare the W2 weights. To signify this, the W1 and W2 strings are separated by a single "|", or other bar or barrier.

For (alphabet string) 42731, ( W1 string)|( W2 string) =11311|42231 or, in bitstring form, B1|B2=001.001.011.001.001||000||100.010.010.011.001 (includes a separator 000, and dots separating character bitstrings), which equals 001001011001001000100010010011001 (without the dots).

Another representation for B1|B2 is B1||000||B2, which is a concatenation of the character bitstrings B1 for characters in the alphabet string 42731, then a separator to terminate the B1 bitstring, the bitstring 000, which occurs nowhere else among the B1 strings for real alphabet characters, and finally all of the bitstrings B2 for characters in the alphabet string 42731. Note that the bitstrings B1 have the prefix property, and within any fixed B1 all bitstrings B2 that occur have the prefix property. This makes it possible to decipher all the W1 values from the bitstrings B1, stopping at the separator 000, and then, knowing the W1 values, the B2 strings can be deciphered.

For example, comparing the alphabet string 42731 against 42721, they are identical in all positions except the fourth, and even there the characters 2 and 3 have the same W1 weights. Clearly 42721<42731.

42731 –> 001001011001001000100010010011001

42721 –> 001001011001001000100010010010001

First difference in this position

Weights W1 (the primary weights) are all the same for these two sequences, so look for differences in weights W2 (the secondary weights). Only if the primary weight sequences are identical are the secondary weights considered.

Note that in FIG. 8 the minimax approach to string lengths is not yet operating. The hierarchical bitstring B1|B2 is not constant length. (The bar "|" in FIG. 8 and FIG. 9 is used as a separator, and need not be pictured as bitstring concatenation with an interposed separator string; separators are used in full hierarchical strings). The maximum length of B1|B2 can be shortened, as described with respect to FIG. 9.

In FIG. 9, the B1 bitstrings are variable in length. The 2-length bitstring for W1 =1 leaves the most addressing space (bitstring length) for the bitstrings for W2, with 4 distinct values; in the 3-length bitstring of W1=3, where there are 2 distinct W2 values. The W1 values 2 and 4 have unique rows with only 1 value for W2, and the bitstrings for B2 are non-existent. This is because no bitstring is needed to differentiate between alternative W2 values in these cases. Note that the bitstrings B1 form a prefix set and the bitstrings for B2 within a constant W1 value also form prefix sets (where any bitstrings at all exist). The total length of the B1|B2 bitstring now has a maximum value of 5, an improvement on the maximum length of 6 in FIG. 8.

To generate 2-level hierarchical prefix bitstrings B1|B2 of equal length, start with W1=1 and determine the number of distinct W2 values associated with W1=1. If there is only 1 such value, then begin the B1 string sequence with 00 . . . 001, and place a barrier bar "|" immediately to the right of this string sequence, thus: 00 . . . 001|.

If, on the other hand, there are multiple values W2=1, 2, . . . K associated with W1=1, then generate B1 as 00 . . . 001 once again, with a barrier bar to its right, and on the right of that, the binary number representing B2, 00 . . . 1, with a known number of bits, ceil($\log_2$(K+1)). Then, successively copy the row to a new row below, adding binary 1 to B2 until the value K is reached. For example, if K=5, the succession of rows will look like:

00 . . . 001|001
00 . . . 001|010
00 . . . 001|011
00 . . . 001|100
00 . . . 001|101

At this point, pass to the cases W1=2, 3, . . . For each successive value of W1 (the value 2, in the example below), count the number K of associated W2 values and determine the number of bits needed to represent K. For example, if W1=2 is associated with W2 values 1, 2, and 3, then only two bits are used to represent B2. In each case, the number of bits to represent B2 will be either equal to, greater than, or less than the number of bits for representing the sequence of B2 bitstrings associated with the prior B1. In these cases, the barrier bar stays in position (for equal number of bits in B2), moves to the left (for a greater number of bits in B2), or moves to the right (for a lesser number of bits in B2). Start by assuming that the bar stays in position, say with W2 values 1, 2, 3, and 4. Then to generate successive rows, leave the bar in position and generate the new value for B1 by adding 1 just to the left of the bar, and generate successive B2 values.

00 . . . 001|001 W1=1, W2=1
00 . . . 001|010 . . .
00 . . . 001|011 . . .
00 . . . 001|100 . . .
00 . . . 001|101 W1=1, W2=5
00 . . . 010|001 W1=2, W2=1
00 . . . 010|010 . . .
00 . . . 010|011 . . .
00 . . . 010|100 W1=2, W2=4

At this point, it is not known how many bits will be used for the set of all B1|B2 strings, but all strings will be cut evenly at the leftmost position where a 1-bit will reside, and thus all strings will have the same total length.

Now consider the case where the bar moves to the left, e.g., with W2 values 1, 2, 3, 4, 5, 6, 7, 8, which requires 4 bits for B2. Then generate these new rows as follows.

00 . . . 001|001 W1=1, W2=1
00 . . . 001|010 . . .
00 . . . 001|011 . . .
00 . . . 001|100 . . .
00 . . . 001|101 W1=1, W2=5
00 . . . 01|0001 W1=2, W2=1 (Note that B1=00 . . . 01 but represents W1=2; this B1 never has B1 with W1=1 as a prefix, because it has fewer leading zeros).
00 . . . 01|0010 . . .
00 . . . 01|0011 . . .
00 . . . 01|0100 . . .
00 . . . 01|0101 . . .
00 . . . 01|0110 . . .
00 . . . 01|0111 . . .
00 . . . 01|1000 W1=2, W2=8

Notice in this sequence that the new value for B1 for W1=2, 00 . . . 01, does not have any of the earlier B1 strings, 00 . . . 001, as a prefix. For example, if the ellipsis ( . . . ) represents two zeros, then 000001 does not have 0000001 as a prefix (they can both represent leaves of a binary tree).

In summary, to generate 2-level hierarchical prefix bitstrings of equal length (for two weights such as those in FIG. 9), start with W1=1 and determine the number of distinct W2 values associated with W1=1. If there are only K values W2=1, 2, . . . K associated with W1=1, then generate B1 as 00 . . . 001, with a barrier bar | to its right, and a sequence of binary bitstrings representing successive values 1, 2, . . . K to the right of that to represent B2. In the special case that K=1, no bitstrings are generated for W2.

For successive values of W1=2, 3, . . . , place a barrier bar to the right of B1 to separate it from successive B2 bitstrings for values W2. After each new bar is placed, generate no strings for unique W2 values; otherwise, generate binary string values representing 1, 2, . . . K when W2 has K values associated with the new W1.

The bar is moved to the right or left or stays in the same place according to the number K of W2 values for each successive W1 value, and the number $\mathrm{ceil}(\log_2(K+1))$ of bits required to represent these values. The bar will be placed to keep the sum of lengths of B1 and B2 constant from one W1 value to the next, given the changing length needs for B2. If the bar moves left, chop off the bits in B1 to the right of the new bar and add 1 to the remaining representation of the prior B1 bitstring. If the bar stays in the same place, add 1 to the representation of the prior B1 bitstring. If the bar moves right, start by adding 1 to the bitstring B1 before moving the bar, then move the bar to the right filling in with zeros in the new B1. In all cases, 1 is added to B1 just before the leftmost bar, prior or current. This approach creates B1 strings that have the prefix property. This is also the case for each sequence of B2 strings.

The above approach can be extended to generate N-level hierarchical prefix bitstrings of equal length.

Preparing to NTransform a Unicode String

To prepare to NTransform a Unicode string, a "Sortkey" table is loaded in memory. The Sortkey table is a copy of the Unicode base table loaded as an array of structs in memory. The Sortkey array is indexed by Unicode identifiers UC ranging from 0x0000 to 0xFFFF, with 64K positions, and the structs have the form ((UW1,UW2), DW, CW). Following this, a "New Weights" table is generated from the rules of the language domain being used (i.e., the locale, such as Hungarian, for example). The New Weights table can be previously generated and saved in storage, so the New Weights table can be loaded later without the need for generation. For example, a New Weights table (Table 3) has the following information:

TABLE 3

| UW1 | UW2 | DW | CW | XUC | ;Latin A variant |
|---|---|---|---|---|---|
| 12 | 255 | 2 | 2 | 0x221e | ;∞ |
| 14 | 2 | 2 | 2 | 0x0061 | ;a |
| 14 | 2 | 2 | 2 | 0x00e6 | ;æ -> ae |
| 14 | 2 | 2 | 3 | 0xff41 | ;Fullwidth a |
| 14 | 2 | 2 | 18 | 0x0041 | ;A |
| 14 | 2 | 2 | 18 | 0x00c6 | ;Æ -> AE |
| 14 | 2 | 2 | 19 | 0xff21 | ;Fullwidth A |

The XUC values are counterparts of the original UC values, and are either new (greater than 0xFFFF), or else differently used, for new rule-generated characters. For example, the XUC for the "a" coming out of "æ" expansion is a different use for the original UC for æ. Older characters (such as "a") have an XUC value copied from the UC value (0x0061) of the Sortkey table. There are no new XUC values in the example above (because all of them are ≤0xFFFF), but an example is now provided of three new characters that come from the Hungarian compression rules, compressing the letters "c" followed by "h" in three different upper/lower case combinations into a single character. The weights given are provided by the rules contained in the Unicode base table as modified by a file replacement for the Hungarian locale.

TABLE 4

| UW1 | UW2 | DW | CW | XUC | ;Character |
|---|---|---|---|---|---|
| 14 | 46 | 2 | 2 | 0x10D54 | ;ch |
| 14 | 46 | 2 | 18 | 0x10D55 | ;Ch |
| 14 | 46 | 2 | 26 | 0x10D56 | ;CH |

The New Weights table (Table 4) is lexicographically ordered by its weights, so at this point, the prefix bitstrings for the UW, DW, and CW weights can be generated using the technique described above. Conceptually, these bitstrings can be affixed to the corresponding New Weights table rows which they represent.

In generating the prefix bitstrings, two additional artificial weights are used, the first being the Duplicate Identifier, known as the DI, and the second being the Reserved Bits value, or RES. When a sequence of rows in the New Weights table has identical weight tuples UW, DW, and CW, a new artificial weight is assigned on the right a sequence of artificial DI weights 0, 1, 2, . . . to disambiguate them. Thus, three identical weight tuples will have DI values 0, 1, and 2, yielding DI bitstrings 00, 01, and 10 (no separator is needed for a weight bitstring prior to DI, so the 0 bitstring can be used). A unique weight tuple in the New Weights table will receive a trivial (0-length) DI. Any non-trivial DI bitstring will then be used in the IW string to be used during inversion.

The RES bits, generated for an artificial RES weight on the right of the DI, are even more artificial than the DI bits. The process thinks that it needs to use a certain number of bits on the right, so it will move its barrier bar to the left at that point, and further compress higher-level weights in order to preserve the constant length it guarantees for all prefix weight bitstrings. Because RES bits are the least significant, they are allocated first.

RES is used to set aside space for special purposes, such as for the IW prefixes, so that even after such a bitstring is added, the total length of bitstrings for each character will be of approximately equal length. Another use for the RES bitstring is to reserve short bitstring lengths for characters that come out of an expansion rule, so that two (or more) characters that result from an expansion will still measure no more than 32 bits in NTransformed length, and thus will not break legacy indexes.

Unicode String is NTransformed to a Concatenated Weight String

Given a string of Unicode character codes UC, it is now described how to generate concatenated weight bitstrings UW, DW, CW, and IW. The successive weight bitstrings of each individual weight are concatenated together without regard to byte boundaries, so no extra bits are used. Various flags are used for special sort orders. In the case of "IGNORENONSPACE", the DW string is absent. In the case of ignoring both case and width, the CW string is dropped; if only one of these is ignored, the CW string is present with the ignored bits projected out. In all such cases, the information missing from the concatenated weight string is desirably contained in the IW string for proper inversion. Certain locales have a rule requiring "reverse diacritics", in which case the DW string is reversed after all weight bitstrings have been generated.

The weight bitstrings are then concatenated in order of significance, after each bitstring is filled out with zeros at the end to make up separators, as described above. The end of the concatenated weight string also has extra zeros added at the end, if necessary, to end on a byte boundary. In particular: (1) The UW string desirably ends with an 8-bit zero separator; (2) The DW string starts with a "leading DW" weight and desirably ends with a 4-bit zero separator; (3) The CW string desirably ends with a 4-bit zero separator; and (4) The IW string needs no separator at the end, but desirably ends on a byte boundary.

To begin the NTransform operation, a cursor is established at the beginning (just before the first character) of the Unicode string of 2-byte codes, and cursors are established at the beginning of a buffer for each of the UW, DW, CW, and IW weights in which bitstrings will be deposited. The most common operation then is to advance the cursor to the next UC in the Unicode string, determine the equivalent XUC for a row in the New Weights table, and pull apart the bitstrings that have been affixed to those rows. There are a number of special cases requiring special weight bitstring handling, which are now described.

There are non-spacing diacritical characters whose only KeyWeights, aside from UW1=1, are DW weights; the only function of these characters is to modify the DW weight of a prior character in a Unicode string, by adding their own DW weight. In the case when such a character appears first in a Unicode string, the "leading DW" of the DW string takes the value of that diacritical character. When there is no leading diacritical character, the "leading DW" weight is set to zero. The "leading DW" value can be modified by numerous non-spacing characters that follow the first, just as any other character's DW weight can be modified. An arbitrarily long sequence of diacritical characters can occur in a Unicode string, all adding together to form a two-byte integer sum in NT that can represent any value from 0x0000 to 0xFFFF. Thus, the DW weights bitstrings encoded for individual characters in a Unicode string can be in the range 0x0000 to 0xFFFF.

The fact that arbitrary characters can take on modified DW weights with a very large number of values is not reflected in the weight-tuples and DW bitstrings in the New Weights table, since encoding so many possibilities (from 0x0000 to 0xFFFF) would utilize too much bitstring length, which is desirably minimized. Moreover, there is no need for normal characters with unusual DW weights (i.e., DW weights unforeseen in the regular Unicode glyphs for characters in a given UW weight category, such as Latin "A": à, á, â, etc.) to have the same length bitstring as all other characters. Such unusual DW weights arise because additional non-spacing diacritical characters appear in the Unicode string, and this means that unusual DW weights for any UW category characters can take extra space to encode their DW weight values.

For this reason, the New Weights table encodes bitstrings for all normal DW weights that represent characters with diacritical marks that occur in a single glyph (e.g., for the Latin "A" category, DW values are provided for à, á, â, etc., but not for aˆ, which does not appear as a normal glyph), and also encode bitstrings for gaps representing DW weights in the range 0x0000 to 0xFFFF that are not normal DW weights.

Thus, for example, the character ∞ would have only the normal DW weight DW=2 (meaning no diacritic mark), but there would also be a bitstring representing DW<2 and a third for DW>2. DW bitstrings for these gaps are used to accommodate unusual DW weights, and an extra bitstring suffix is affixed to represent the difference when the first weight value at the bottom of the gap is subtracted from DW (if the gap starts with value 0, as in DW<2, then DW is used rather than any difference). Thus, for a weight tuple ((12, 255), 1, 2) coming out of a bitstring encoding of a Unicode string, the UW=(12, 255) reveals that this character is ∞ (it is a unique UW for that category), but that the DW string has been modified because of succeeding diacritic characters. In that case, the DW bitstring value will be the bitstring for the gap DW<2, followed by the bit 1 (if the weight tuple were ((12, 255), 0, 2), then the bit following the gap bitstring would be 0. On the other hand, for the tuple ((12, 255), 0xF017, 2), the DW bitstring value will be the bitstring for the gap DW>2, followed by the 16-bit value representing 0xF017–3, which is 0xF014.

As another example, the Latin "A" category has an initial run of normal DW values given by: 2, 3, 14, 15, 18, 19, 20, 21, 23, 25 (note that there are DW values not listed with DW>25). There will be a bitstring assigned to each of these normal DW values, and also for growth points: (1) 0<=DW<2, (2) 3<DW<14, (3) 15<DW<18, (4) 21<DW<23, and (5) 23<DW<25. Now a Latin "A" category weight ((14, 2), 10, 2) would have a DW bitstring value which is the bitstring for the gap 3<DW<14, followed by the 4-bit value 0111, representing 10−4, or 6. The reason a 4-bit value is required is that the largest string to be contained is 1010, representing 13−4, or 9. Note that DW weights for gaps have two parts: the bitstring in the New Weights table representing the gap, followed by the bitstring that specifies the particular DW value in the gap.

Inversion

It is now described how the NTransform from a Unicode string to a concatenated weights string takes place, along with the structure of bitstring fragments called elements that are placed in the IW string, for each Unicode string character, to aid in later inversion. At the beginning of the NTransform operation, cursors are established just prior to the first character of the Unicode string and at the beginning of a buffer for each of the UW, DW, CW, and IW weights, where the bitstrings will be deposited. The most common operation then is to advance the cursor to the next UC in the Unicode string, determine the equivalent XUC for a row in the New Weights table, pull apart the weight bitstrings that have been affixed to those rows, and place them in the appropriate weight string buffers. Note that the New Weights table, though ordered by (UW, DW, CW) weights tuples of the characters, are also accessible by direct XUC value through an indirect indexing structure.

Each time the cursor into the Unicode string refers to a new character (except for those that will be involved in compressions), one IW element (a bitstring fragment for the character containing needed inversion information) will be placed in the output IW bitstring. Compressions place one IW element for each of their one or two output weights. There is no separator at the end of the IW bitstring, but it is padded with binary 0s to make an integral number of bytes.

Each IW element starts with a prefix from the IW prefix tree, referred to as an opcode. Following the opcode, there may be additional bits to help identify the character or compression sequence. These additional bits can contain DI values, or "Duplicates Identifiers". The great majority of characters have nonexistent DI values, because their weights identify them uniquely. Table 5 contains a list of possible opcodes (other versions of this are possible) and their significance.

TABLE 5

| opcode name | opcode bits | followed by suffix | length of suffix |
|---|---|---|---|
| Normal | 0 | DI (if there are dups) | varies |
| Punctuation | 1110 | DI (if there are dups) | varies |
| Unsortable | 1111 | DI | 15 bits |
| RepeatNonKana | 100 | ID of Kana/Cho-On | 4 bits (12 Kana/Cho-Ons) |
| Diacritical.ModNorm | 1100 | None | |
| Diacritical.ModRNK | 11010 | ID of Kana/Cho-On | 4 bits (12 Kana/Cho-Ons) |
| Diacritical.NonLast | 110110 | ID of diacritical char | 9 bits |
| Diacritical.Last | 110111 | ID of dc ‖ DI Modchar | 9 bits +len(DI) |
| TrailingSp | 1010 | count | 1 for 0, up to 17 for non-0 |
| Reserved for Future | 1011 | Future | Future |

Note that the most common case of Unicode character handling is for characters that do not have duplicates and are not members of any unusual category. Variation from common Unicode character handling is now described. It is contemplated that additional and/or alternate weights can be used, as well as special characters such as Kana characters and Kana Repeat characters.

For unsortable characters, UW1=0. When a UC is encountered by the advancing Unicode string cursor that corresponds to one of the empty positions in the original KeyWeights table, no weight strings will be deposited in the UW, DW, and CW buffers. The equivalent XUC value for all such unsortable characters will occur in the New Weights table with all-0 weights and with a DI to indicate which unsortable character occurred. The IW entry placed will be the Unsortable opcode (1111) followed by the DI (there will be a 15 bit DI, because there are many unsortable characters).

For non-spacing diacritical characters, UW1=1. When a diacritical character with UW1=1 is encountered by the advancing Unicode string cursor, the most recently placed DW weight bitstring is re-examined, and the DW weight of the diacritical character is added (this weight might be added to numerous times, so it is kept available for future changes). Then information about the affected character is modified in the IW bitstring. If the affected character was Normal, with original IW opcode 0, the opcode is changed to Diacritical.ModNorm, bits 1100, and any DI bitstring for the affected character is saved for placement in the IW after the last diacritical character in sequence (this is for proper inversion later); if the affected character was a RepeatNonKana character (IW entry opcode 100), then the opcode is modified to be Diacritical.ModRNK (bits 11010), and any DI bitstring for the modified character is saved as in the previous case.

The diacritical character just encountered has no weights placed in the weight output bitstrings, but an IW entry is placed consisting of either the opcode for Diacritical.Last (bits 110111) or Diacritical.NonLast (bits 110110), depending on whether the diacritical character is or is not the last in sequence after the affected character. After this, successive characters from the Unicode string input are accessed, and the IW entries for Diacritical.NonLast are repeated while successive diacritical characters are encountered in the Unicode string. When the next character in the Unicode input string is non-diacritical, it is ensured that the last diacritical character in sequence has an IW opcode Diacritical.Last (bits 110111), and this is followed with the suffix which is the DI of the original affected character. At the same time, the DW weight of the affected character can be stored in the appropriate bitstring format.

For expansion characters, UW1=2. When an expansion character UC is encountered by the advancing Unicode string cursor, this is recognized having UW1=2 and references a special table containing expansion information. There are two weights placed in each of the UW, DW, and CW bitstrings, and information to show this is an expansion is placed in the IW string. The IW entry is a Normal opcode (bit 0) followed by the DI of the character in the first position resulting from the specific expansion.

For punctuation characters, UW1=6. When a punctuation character UC is encountered by the advancing Unicode string cursor, the equal XUC is looked up in the New Weight table, and the SW weight bitstring is a bitstring encoding of the original UW weight of the KeyWeights table. A counter is kept while advancing through the Unicode string since the last punctuation character, not counting unsortable characters or diacritical characters, and this specifies the offset to be used in the SW bitstring encoding, ($P_{13}$ OFFSET, P_UW). There might be duplicate UW weights, so for an IW entry a punctuation opcode (bits 1110) is provided followed by a suffix DI (if there are duplicates for this UW).

Regarding compressions, as all characters are encountered by the advancing Unicode string cursor, the logic of the transformation notices if a character to be transformed is the first character of a compression list, so it looks at the list of compressions in memory. If a character is recognized as the first of a compression sequence, then successive characters are examined in the input string to determine if a match exists. If so, the XUC for the resulting compression determines the compressed character weight, and its output bitstring fragments. If no match exists, then characters examined in the input Unicode string that have been matched so far are handled in the usual way.

When a compression sequence is matched, the output weight(s) from the compression are placed in the various weight buffers, and Normal IW opcodes (bit 0) are placed for each character, with accompanying DI suffixes if duplicate weights are possible.

Regarding blank padding at the end of a string, when the advancing Unicode string cursor comes to the end of the string, it recalls how many blank characters have come in sequence. No weights for blanks are actually deposited in the weight bitstrings, but an IW entry is created with a TrailingSp opcode (bits 1010) and a suffix consisting of the count of blanks that actually occurred at the end of the Unicode string. The count consists of the single bit 0 if there were no blanks at the end, otherwise with a bit 1 followed by a 16-bit count allowing for up to 64K trailing blanks.

Now that the system is presented with a concatenated weight bitstring for UW, DW, CW, and IW, generated as described above, it is desirable to recapture the original Unicode string of UC values from this information.

Begin by looking at the concatenated bitstring to parse it into individual weights for each of the characters. Since each of the weight bitstrings is terminated by a prefix-unique all-0s separator, conceptually create cursors to the beginning of each of the UW, DW, CW, and IW bitstrings in a quick pass. Each of the individual character weight bitstrings for UW, DW, and CW are generated by prefix trees known to the NTransform inversion logic, so it is possible to parse each of the weight bitstrings into arrays of numerical weights for the successive characters, and in the case of SW to parse the bitstring to determine the offset/$UW_{13}$ Weight. The IW bitstring can be parsed into opcodes followed by suffixes whose length is known once the character weights are decoded.

Proceed through the weight bitstrings, using the IW bitstring to drive the loop. As the cursor proceeds through the IW bitstring, it can be determined what kind of situation is obtained in each successive character. An opcode of 0 means a normal character follows, with no modifications due to nonspace marks, and parsing the weight bitstrings gives the numeric weights involved. When weights are looked up in the New Weights table, the number of duplicates can be determined for that tuple of weights, and if duplicates exist there must be a DI suffix for this opcode. The DI value is determined from its bitstring in the same way that the other (real) weights are matched, by a hierarchical prefix tree matching procedure, and then the DI value determines exactly what character initiated this set of weights. At the end of this, the IW entry has been parsed through and the next can be parsed. The same approach works when an Unsortable opcode (1111) occurs in IW. The DI value determines the UC of the character to place in the Unicode string (there are no weights in UW, DW, and CW bitstrings for unsortable characters).

Repeats of non-Kana characters desirably will have their own IW entry opcodes (bits 100), and then the suffix ID tells which Kana or other character falls in the current position, and that character can be placed in the Unicode string. A repeat of a Kana character will have a Normal opcode of 0, and it is individually tabulated in the New Weights table, so its decoded weight tuple and its DI will completely identify the situation.

When an IW opcode of Diacritical.ModNorm (bits 1100) or Diacritical.ModRNK (bits 11010) is encountered, it is determined that an IW entry for a diacritic character follows, either Diacritical.NonLast (bits 110110) or Diacritical.Last (bits 110111); the suffix of such an opcode tells which diacritic character occurs, and this can be placed in the Unicode string following the original affected character whose weights are still in doubt. Diacritic characters are continued to be found in the IW string until there are no more, along with subtracting each successive DW value from the DW value of the original weight tuple. This process results in a individually-tabulated weight tuple; if not, there has been an error. It is determined if that weight tuple has duplicates, any DI suffix is then applied at the end of the final diacritic IW entry for that character, and the UC is placed in the Unicode string, following it with the diacritic characters that have been decoded.

When the IW entry has a punctuation opcode (bits 1110), look in the string for the next character to place in the Unicode string. Then the UW of the punctuation character is determined from the entry, and the DI determines which particular UC is to be used in case there are duplicates with this UW. Finally, a TrailingSp opcode (bits 1010) determines how many trailing spaces to place in the Unicode string.

Although the examples described above are directed to a Unicode implementation, the present invention is applicable to any character set (e.g., ASCII) and any domain in which sorting is defined on multi-level weights, for example.

While the present invention has been described in connection with the preferred embodiments of the various figures, it is to be understood that other similar embodiments may be used or modifications and additions may be made to the described embodiment for performing the same function of the present invention without deviating therefrom. Furthermore, it should be emphasized that a variety of computer platforms, including handheld device operating systems and other application specific operating systems are contemplated, especially as the number of wireless networked devices continues to proliferate. Still further, the present invention may be implemented in or across a plurality of processing chips or devices, and storage may similarly be effected across a plurality of devices. Therefore, the present invention should not be limited to any single embodiment, but rather should be construed in breadth and scope in accordance with the appended claims.

What is claimed is:

1. A computerized method of generating an invertible bitstring for use in a computer environment, comprising:

receiving a string of characters at a computing device;

performing by the computing device a normalizing transformation on the string of characters to generate an invertible bitstring; and inverting the generated bitstring to recover the string of characters, wherein inverting the generated bitstring comprises parsing the generated bitstring to recover a set of weights for each character in the string of characters; and recovering each character in the string of characters from the bitstring using the set of weights.

2. The method of claim 1, wherein the length of the generated bitstring is equal to a minimum possible maximum encoded length for the string of characters.

3. The method of claim 1, wherein performing the normalizing transformation comprises receiving the set of weights for each character in the string of characters and generating the bitstring based on the set of weights.

4. The method of claim 3, wherein receiving the set of weights for each character in the string of characters comprises retrieving the set of weights from a weight table.

5. The method of claim 3, wherein the set of weights comprises at least one of a weight associated with a character category and a weight associated with a diacritical mark.

6. The method of claim 3, wherein the set of weights comprises a set of weight strings, each weight string being represented by an associated (0–1)-bit sequence.

7. The method of claim 1, further comprising compressing the generated bitstring to generate a prefix-coded bitstring.

8. The method of claim 7, wherein compressing comprises applying a minimax technique to the generated bitstring.

9. A string processing system, comprising:

a first data source using a string of characters;

a weight table comprising a plurality of characters, including the characters in the string of characters, each character having an associated code, primary weight, and secondary weight;

a processor to perform a normalizing transformation on the string of characters to generate a an invertible bitstring; and an inverter to invert the generated bitstring to recover the string of characters by parsing the generated bitstring to the recover primary weight and secondary weight for each character in the string of characters; and recovering each character in the string of characters from the bitstring using the primary weight and secondary weight.

10. The system of claim 9, wherein the primary weight comprises an associated primary weight string, and the secondary weight comprises an associated secondary weight string.

11. The system of claim 10, wherein each weight string is represented by an associated (0–1)-bit sequence.

12. The system of claim 9, wherein the primary weight comprises a weight associated with a character category and the secondary weight comprises a weight associated with a diacritical mark.

13. The system of claim 9, further comprising a compressor to compress the generated bitstring into a prefix-coded bitstring.

* * * * *